United States Patent
Laskaris et al.

[11] Patent Number: 5,801,609
[45] Date of Patent: Sep. 1, 1998

[54] MRI HEAD MAGNET

[75] Inventors: Evangelos Trifon Laskaris, Schenectady; Michele Dollar Ogle, Burnt Hills, both of N.Y.

[73] Assignee: General Electric Company, Schenectady, N.Y.

[21] Appl. No.: 837,881

[22] Filed: Apr. 25, 1997

[51] Int. Cl.$^6$ .................................. G01V 3/00; H01F 6/06
[52] U.S. Cl. ..................... 335/216; 335/299; 335/301; 324/319; 600/422
[58] Field of Search ..................... 335/216, 296–306; 324/318–320; 600/410, 415, 421, 422

[56] References Cited

U.S. PATENT DOCUMENTS

| | | | |
|---|---|---|---|
| 5,396,207 | 3/1995 | Dorri et al. | 335/216 |
| 5,416,415 | 5/1995 | Dorri et al. | 324/318 |
| 5,563,566 | 10/1996 | Laskaris et al. | 335/216 |
| 5,568,102 | 10/1996 | Dorri et al. | 335/216 |

Primary Examiner—Michael L. Gellner
Assistant Examiner—Raymond Barrera
Attorney, Agent, or Firm—Douglas E. Erickson; Marvin Snyder

[57] ABSTRACT

A magnetic resonance imaging (MRI) magnet includes different-diameter, longitudinally-proximate, first and second coil form segments. First and second superconductive coils are wound, respectively, around the first and second coil form segments. A first spacer ring is attached to the first coil form segment and longitudinally abuts a lateral side of the first superconductive coil, and a second spacer ring circumferentially surrounds and is attached to the second coil form segment and longitudinally abuts a lateral side of the second superconductive coil. Two or more circumferentially-spaced-apart plate members are attached to, and extend radially outward from, the first and second spacer rings.

10 Claims, 3 Drawing Sheets

5,801,609

MRI HEAD MAGNET

FIELD OF THE INVENTION

The present invention relates generally to a superconductive magnet used to generate a high magnetic field as part of a magnetic resonance imaging (MRI) diagnostic system, and more particularly to such a magnet having a compact design for imaging specific parts of the human body, such as the brain.

BACKGROUND OF THE INVENTION

MRI systems employing superconductive magnets are used in various fields such as medical diagnostics. Known superconductive magnets include the magnet design of U.S. Pat. No. 5,416,415 entitled "Over-Shoulder MRI Magnet For Human Brain Imaging" which was issued May 16, 1995 to Dorri et al. In that design, the magnet's annularly-cylindrical-shaped vacuum enclosure has a smaller-diameter bore at one longitudinal end and a larger-diameter bore at the other longitudinal end. The larger-diameter bore fits over the patient's shoulders while the smaller-diameter bore receives the patient's head for MRI brain imaging. Inside the vacuum enclosure is a thermal shield, and inside the thermal shield are superconductive coils supported by a coil form. The annularly-cylindrical coil form must be of sufficient size and weight to be robust enough to resist the bending moment applied to the step area where the larger-diameter coil form portion transitions to the smaller-diameter coil form portion. The bending moment is applied by the four Tesla magnet as the electromagnetic forces push the left-most superconductive coil to the right and push the other superconductive coils, especially the right-most superconductive coil, to the left. What is needed is a lighter weight superconductive magnet designed for high magnetic field MRI imaging of the human brain.

SUMMARY OF THE INVENTION

The magnetic resonance imaging (MRI) magnet of the invention includes generally annularly-cylindrical-shaped first and second coil form segments which are generally coaxially aligned, which have first and second longitudinal ends, and which have their second longitudinal ends positioned longitudinally near each other. The outer diameter of the second coil form segment is less than the outer diameter of the first coil segment. A first superconductive coil is wound around the first coil form segment near its first longitudinal end, and a second superconductive coil is wound around the second coil form segment near its first longitudinal end. A first spacer ring is attached to the first coil form segment and longitudinally abuts a lateral side of the first superconductive coil, and a second spacer ring circumferentially surrounds, and is attached to, the second coil form segment and longitudinally abuts a lateral side of the second superconductive coil. Two or more circumferentially-spaced-apart plate members are attached to, and extend radially outward from, the first and second spacer rings and are positioned radially outward from, and spaced apart from, the first and second superconductive coils.

Several benefits and advantages are derived from the invention. The greatest electromagnetic forces come from the longitudinal-inwardly-directed forces exerted by the longitudinally outermost first and second superconductive coils. Such coils may be wound on thin first and second coil form segments. The forces are reacted through the first and second spacer rings to the attached plate members in resulting structure which is lighter in weight and easier to manufacture and assemble than is the bulky coil form of the prior art.

DETAILED DESCRIPTION OF THE INVENTION

Figure 1:
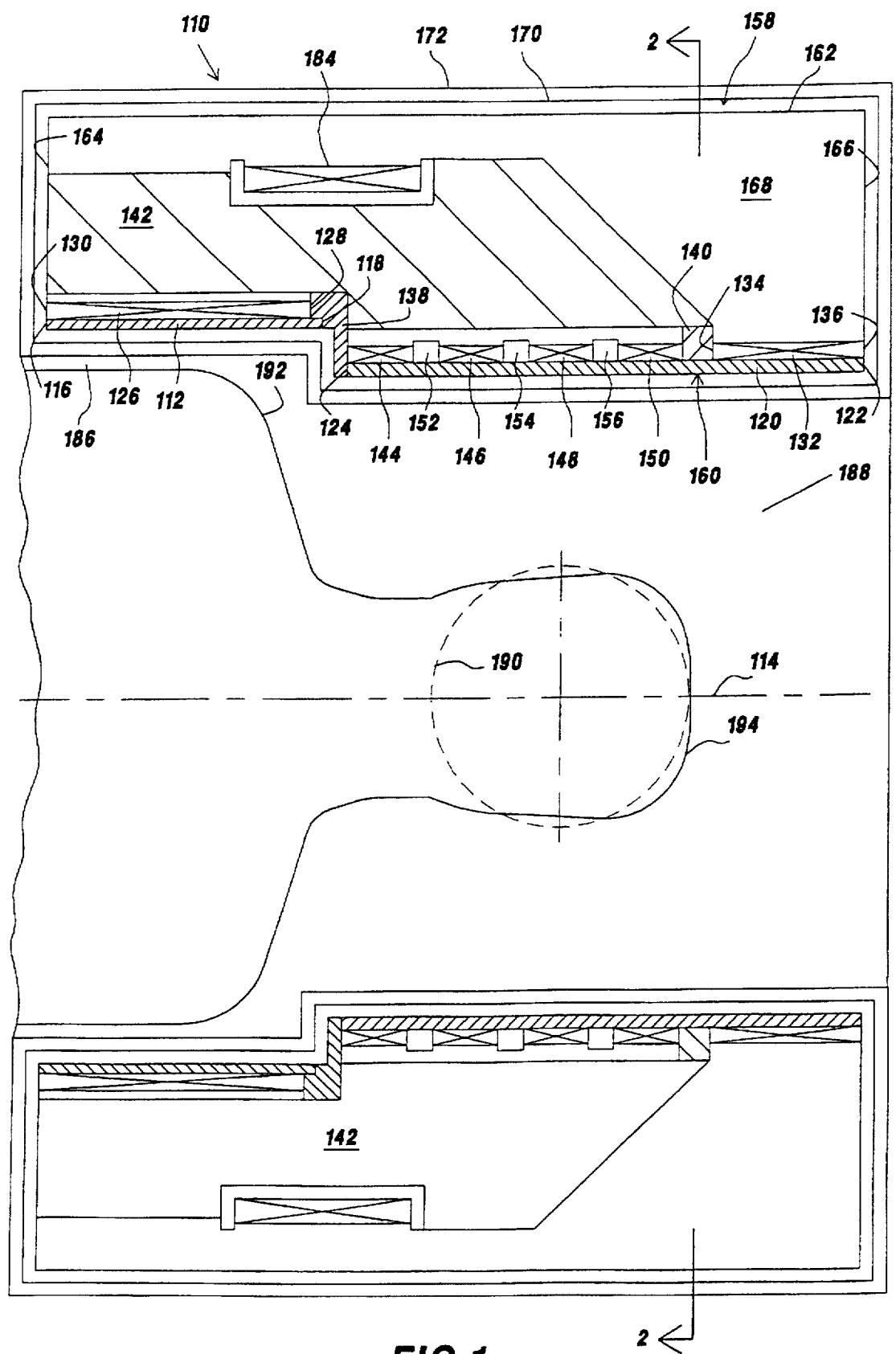
FIG. 1 is a schematic cross-sectional top-planar view of a first preferred embodiment of an MRI magnet of the invention.
Figure 2:
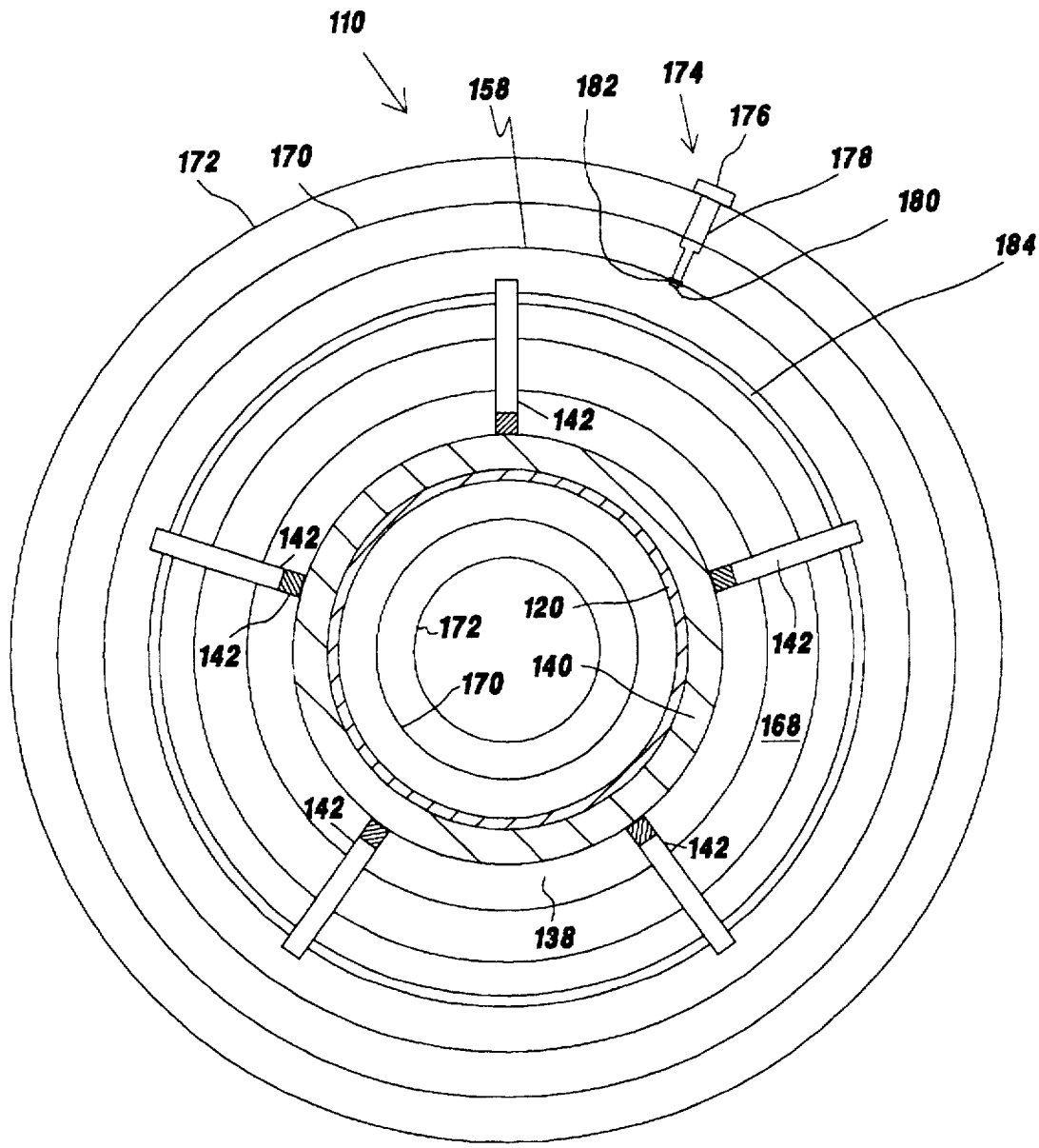
FIG. 2 is a cross-sectional view taken along lines 2—2 of FIG. 1.

Referring now to the drawings, FIGS. 1 and 2 show a first preferred embodiment of the magnetic resonance imaging (MRI) magnet 110 of the present invention. The magnet 110 includes a generally annularly-cylindrical-shaped first coil form segment 112 having a generally longitudinally extending axis 114. The first coil form segment 112 has a generally constant outer diameter, a first longitudinal end 116, and a second longitudinal end 118. The magnet 110 also includes a generally annularly-cylindrical-shaped second coil form segment 120. The second coil form segment 120 has a generally constant outer diameter which is less than the outer diameter of the first coil form segment 112. The second coil form segment 120 also has a first longitudinal end 122 and further has a second longitudinal end 124 disposed longitudinally proximate the second longitudinal end 118 of the first coil form segment 112. Preferably, the first and second coil form segments 112 and 120 consist essentially of metal such as, but not limited to, non-magnetic stainless steel.

The magnet 110 also includes a first superconductive coil 126 which is generally coaxially aligned with the longitudinally extending axis 114 and which is circumferentially wound around the first coil form segment 112. The first superconductive coil 126 also has a first lateral side 128 and further has a second lateral side 130 longitudinally disposed proximate the first longitudinal end 116 of the first coil segment 112. The magnet 110 further includes a second superconductive coil 132 which is generally coaxially aligned with the longitudinally extending axis 114 and which is circumferentially wound around the second coil form segment 120. The second superconductive coil 132 also has a first lateral side 134 and further has a second lateral side 136 longitudinally disposed proximate the first longitudinal end 122 of the second coil segment 120. Preferably, the first and second superconductive coils 126 and 132 comprise non-impregnated niobium-titanium superconductive coils which need to be supported, respectively, by the first and second coil form segments 112 and 120. Such non-impregnated coils are easier and less expensive to make than self-supporting, epoxy-impregnated superconductive coils which do not need to be supported by coil forms.

The magnet 110 further includes a first spacer ring 138 which is generally coaxially aligned with the longitudinally extending axis 114 and which is attached to the first coil form segment 112. The first spacer ring 138 longitudinally abuts the first lateral side 128 of the first superconductive coil 126. The magnet 110 additionally includes a second spacer ring 140 which is generally coaxially aligned with the longitudinally extending axis 114 and which circumferentially surrounds, and is attached to, the second coil form segment 120. The second spacer ring 140 longitudinally abuts the first lateral side 134 of the second superconductive coil 132. In an exemplary embodiment, the first superconductive coil 126 is the only superconductive coil which is circumferentially wound around the first coil form segment 112, and the first spacer ring 138 abuts and connects together the second longitudinal end 118 of the first coil form segment 112 and the second longitudinal end 124 of the second coil form segment 120. Preferably, the first and second spacer rings 138 and 140 consist essentially of metal such as, but not limited to, non-magnetic stainless steel. In a preferred construction, the first spacer ring 138 is welded to the second longitudinal end 118 of the first coil form segment 112 and is welded to the second longitudinal end 124 of the second coil form segment 120, and the second spacer ring 140 is welded to the second coil form segment 120.

The magnet 110 additionally includes a plurality of (and preferably at least three) circumferentially-spaced-apart plate members 142 attached to, and extending radially outward from, the first and second spacer rings 138 and 140 and disposed radially outward from, and spaced apart from, the first and second superconductive coils 126 and 132. Preferably, the plate members 142 consist essentially of metal such as, but not limited to, non-magnetic stainless steel. In a preferred construction, the plate members 142 are welded to the first and second spacer rings 138 and 140.

In a preferred embodiment, the magnet 110 also includes a multiplicity of (and preferably at least three) additional superconductive coils 144, 146, 148, and 150 which are generally coaxially aligned with the longitudinally extending axis 114 and which are circumferentially wound around the second coil form segment 120. Here, the magnet 110 further includes additional spacer rings 152, 154, and 156 equal in number to one less than the number of additional superconductive coils (i.e., equal in number to the previously stated multiplicity minus one). The additional spacer rings 152, 154, and 156 are generally coaxially aligned with the longitudinally extending axis 114 and circumferentially surround, and are attached to, the second coil form segment 120. The additional spacer rings 152, 154, and 156 are each longitudinally disposed between, and abut, a corresponding adjacent pair of the additional superconductive coils 144, 146, 148, and 150. For example, additional spacer ring 154 is longitudinally disposed between, and abuts, the pair of additional superconductive coils 146 and 148, such coil pair being the adjacent pair of additional superconductive coils corresponding to additional spacer ring 154. Furthermore, one of the additional superconductive coils 144 longitudinally abuts the first spacer ring 138 and another of the additional superconductive coils 150 longitudinally abuts the second spacer ring 140. Preferably, the additional superconductive coils 144, 146, 148, and 150 comprise non-impregnated niobium-titanium superconductive coils which need to be supported by the second coil form segment 120. Preferably, the additional spacer rings 152, 154, and 156 consist essentially of plastic such as, but not limited to fiberglass or another FRP (fiber reinforced plastic). In a preferred construction, the additional spacer rings 152, 154, and 156 are adhesively bonded to the second coil form segment 120 and are not attached to, and preferably are spaced apart from, the plate members 142. In an exemplary enablement, the magnet 110 moreover includes a coil overwrap (omitted from the figures for clarity), such as an aluminum or non-magnetic stainless steel ring, which circumferentially surrounds each superconductive coil and each additional superconductive coil to prevent radially outward movement of such coils due to the electromagnetic forces generated during magnet operation.

Typically, a liquid cryogen (such as, but not limited to, liquid helium) and/or a cryocooler coldhead is used to cool the first and second superconductive coils 126 and 132 and the additional superconductive coils 144, 146, 148, and 150. In a preferred construction, the magnet 110 also includes a generally toroidal-shaped dewar 158 having a circumferential inner wall 160 at least partially defined by the first and second coil form segments 112 and 120, having a circumferential outer wall 162, having an annular side wall 164 attached to the first longitudinal end 116 of the first coil form segment 112 and connecting together the circumferential inner and outer walls 160 and 162, and having an additional annular side wall 166 attached to the first longitudinal end 122 of the second coil form segment 120 and connecting together the circumferential inner and outer walls 160 and 162. The first and second superconductive coils 126 and 132; the additional superconductive coils 144, 146, 148, and 150; the first and second spacer rings 138 and 140; the additional spacer rings 152, 154, and 156; and the plate members 142 are disposed inside the dewar 158. The dewar 158 contains a liquid cryogen 168 (such as, but not limited to, liquid helium) which is in physical contact with the first and second superconductive coils 126 and 132 and with the additional superconductive coils 144, 146, 148, and 150. The second lateral side 130 of the first superconductive coil 126 longitudinally abuts the annular side wall 164 of the dewar 158, and the plate members 142 are attached to the annular side wall 164 of the dewar 158. The second lateral side 136 of the second superconductive coil 132 longitudinally abuts the additional annular side wall 166 of the dewar 158, and the plate members 142 are spaced apart from the additional side wall 166 of the dewar 158.

Also in a preferred construction, the magnet 110 includes a thermal shield 170 generally spaced apart from, and generally surrounding, the dewar 158 and a vacuum enclosure 172 generally spaced apart from, and generally surrounding, the thermal shield 170. It is noted that thermally-insulating spacers are conventionally used to separate and support the thermal shield 170 from the vacuum enclosure 172 and the dewar 158 from the thermal shield 170 (such spacers being omitted from the figures for clarity). Furthermore, the magnet 110 includes a cryocooler coldhead 174 having a housing 176 attached to the vacuum enclosure 172, having a first stage 178 in thermal contact with the thermal shield 170, and having a second stage 180 extending into the dewar 158. Additionally, the magnet 110 includes a recondensing coil 182 attached to the second stage 180 of the cryocooler coldhead 174 to recondense boiled-off liquid cryogen 168.

Preferably, the first and second superconductive coils 126 and 132 carry an electric current in a same first direction. The first direction is defined to be either a clockwise or a counterclockwise circumferential direction about the longitudinally extending axis 114 with any slight longitudinal component of current direction being ignored. Typically, the additional superconductive coils 144, 146, 148, and 150 also carry an electric current in the same first direction. When stray magnetic fields are a concern, it is preferred that the magnet 110 also include a superconductive shielding coil 184 carrying an electric current in a direction opposite to the first direction. The superconductive shielding coil 184 is generally coaxially aligned with the longitudinally extending axis 114 and is disposed radially outward from, and spaced apart from, the first and second superconductive coils 126 and 132. The superconductive shielding coil 184 is supported by the plate members 142.

The magnet 110 has a larger-diameter first bore 186 defined by the inside diameter of that portion of the vacuum enclosure 172 which is proximate the first coil form segment 112 and has a smaller-diameter second bore 188 defined by the inside diameter of the remaining portion of the vacuum enclosure 172 which is proximate the second coil form segment 120. The magnet 110 also includes a gradient coil disposed generally in the second bore 188 and a radio-frequency coil disposed generally in the second bore 188 radially inward of the gradient coil (such gradient and radio-frequency coils omitted from the figures for clarity. Also, as is known to those skilled in the art, an MRI magnet typically may also include passive shims, a gradient shield, and a gap between the vacuum enclosure 172 and the gradient coil, and typically may also include a radio-frequency shield and a gap between the gradient coil and the radio-frequency coil (such shims, shields, and gaps not shown in the figures for clarity). It is mentioned that the gradient shield may be omitted if continuous metallic paths are avoided on and within the vacuum enclosure 172 for an eddy-current-free magnet 110.

Although the magnet 110 may be used to image various parts of the human body, such as limbs, the first and second superconductive coils 126 and 132 and the additional superconductive coils 144, 146, 148, and 150 of the magnet 110 preferably are designed, as is within the skill of the artisan, specifically for high magnetic field MRI imaging of the human brain having a total magnetic field strength of at least three Tesla within the spherical imaging volume 190 (shown in dotted line) which is located within the second bore 188 and which is centered along the longitudinally extending axis 114. The first and second bores 186 and 188 preferably are sized such that the patient's shoulders 192 fit inside the first bore 186 with the patient's head 194 at least partially extending into the second bore 188 and such that the second bore 188 has a diameter which is smaller than the width of the patient's shoulders 192.

Figure 3:
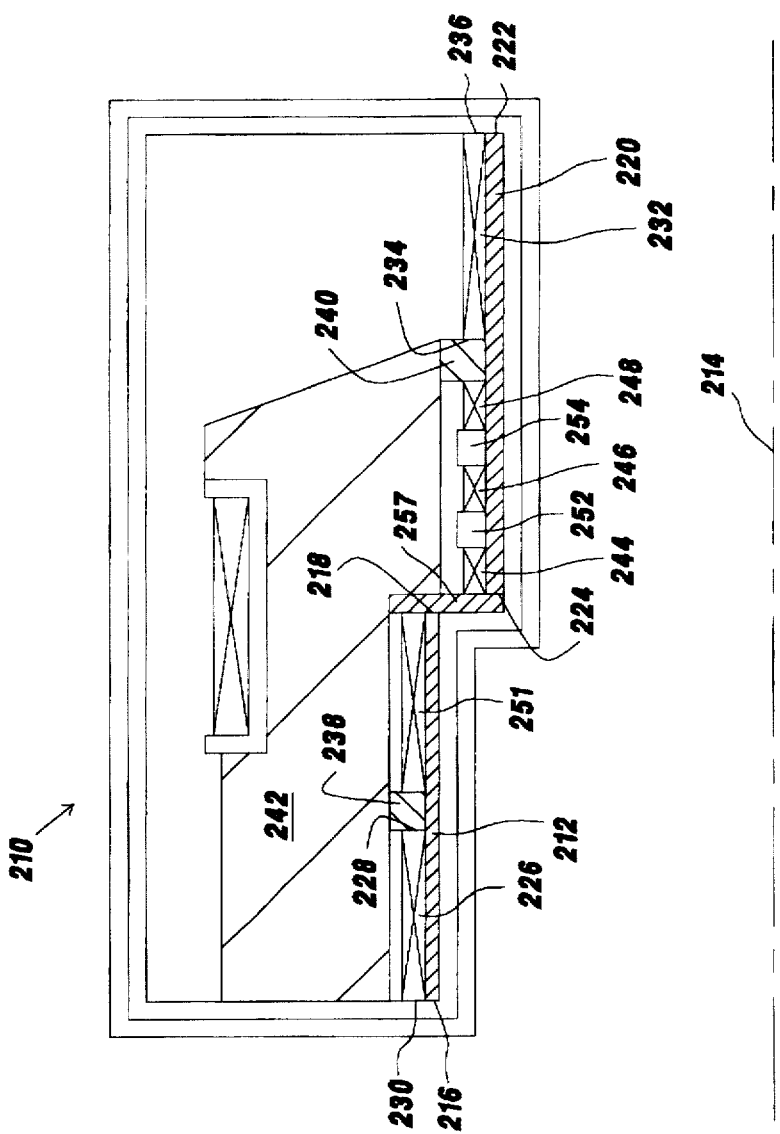
FIG. 3 is a schematic cross-sectional top-planar view of a symmetric half of a second preferred embodiment of an MRI magnet of the invention.

Referring again to the drawings, FIG. 3 shows a second preferred embodiment of the magnetic resonance imaging (MRI) magnet 210 of the present invention. The magnet 210 includes a generally annularly-cylindrical-shaped first coil form segment 212 having a generally longitudinally extending axis 214. The first coil form segment 212 has a generally constant outer diameter, a first longitudinal end 216, and a second longitudinal end 218: The magnet 210 also includes a generally annularly-cylindrical-shaped second coil form segment 220. The second coil form segment 220 has a generally constant outer diameter which is less than the outer diameter of the first coil form segment 212. The second coil form segment 220 also has a first longitudinal end 222 and further has a second longitudinal end 224 disposed longitudinally proximate the second longitudinal end 218 of the first coil form segment 212. Preferably, the first and second coil form segments 212 and 220 consist essentially of metal such as, but not limited to, non-magnetic stainless steel.

The magnet 210 also includes a first superconductive coil 226 which is generally coaxially aligned with the longitudinally extending axis 214 and which is circumferentially wound around the first coil form segment 212. The first superconductive coil 226 also has a first lateral side 228 and further has a second lateral side 230 longitudinally disposed proximate the first longitudinal end 216 of the first coil segment 212. The magnet 210 further includes a second superconductive coil 232 which is generally coaxially aligned with the longitudinally extending axis 214 and which is circumferentially wound around the second coil form segment 220. The second superconductive coil 232 also has a first lateral side 234 and further has a second lateral side 236 longitudinally disposed proximate the first longitudinal end 222 of the second coil segment 220. Preferably, the first and second superconductive coils 226 and 232 comprise non-impregnated niobium-titanium superconductive coils which need to be supported, respectively, by the first and second coil form segments 212 and 220. Such non-impregnated coils are easier and less expensive to make than self-supporting, epoxy-impregnated superconductive coils which do not need to be supported by coil forms.

The magnet 210 further includes a first spacer ring 238 which is generally coaxially aligned with the longitudinally extending axis 214 and which circumferentially surrounds, and is attached to, the first coil form segment 212. The first spacer ring 238 longitudinally abuts the first lateral side 228 of the first superconductive coil 226. The magnet 210 additionally includes a second spacer ring 240 which is generally coaxially aligned with the longitudinally extending axis 214 and which circumferentially surrounds, and is attached to, the second coil form segment 220. The second spacer ring 240 longitudinally abuts the first lateral side 234 of the second superconductive coil 232. Preferably, the first and second spacer rings 238 and 240 consist essentially of metal such as, but not limited to, non-magnetic stainless steel. In a preferred construction, the first spacer ring 238 is welded to the first coil form segment 212, and the second spacer ring 240 is welded to the second coil form segment 220.

The magnet 210 additionally includes a plurality of (and preferably at least three) circumferentially-spaced-apart plate members 242 attached to, and extending radially outward from, the first and second spacer rings 238 and 240 and disposed radially outward from, and spaced apart from, the first and second superconductive coils 226 and 232. Preferably, the plate members 242 consist essentially of metal such as, but not limited to, non-magnetic stainless steel. In a preferred construction, the plate members 242 are welded to the first and second spacer rings 238 and 240.

In the second preferred embodiment, the magnet 210 also includes a supplemental spacer ring 257 which is generally coaxially aligned with the longitudinally extending axis 214, which abuts, and connects together, the second longitudinal end 218 of the first coil form segment 212 and the second longitudinal end 224 of the second coil form segment 220, and which is unattached to any of the plate members 242. Preferably, the supplemental spacer ring 257 consists essentially of metal such as, but not limited to, non-magnetic stainless steel. In a preferred construction, the supplemental spacer ring 257 is welded to the second longitudinal end 218 of the first coil form segment 212 and is welded to the second longitudinal end 224 of the second coil form segment 220. The magnet 210 additionally includes a supplemental superconductive coil 251 which is generally coaxially aligned with the longitudinally extending axis 214, which is circumferentially wound around the first coil form segment 212, and which is longitudinally disposed between, and abuts, the first spacer ring 238 and the supplemental spacer ring 257.

Preferably, the magnet 210 moreover includes a multiplicity of additional superconductive coils 244, 246, and 248 which are generally coaxially aligned with the longitudinally extending axis 214 and which are circumferentially wound around the second coil form segment 220. Here, the magnet 210 further includes additional spacer rings 252 and 254 equal in number to one less than the number of additional superconductive coils (i.e., equal in number to the previously stated multiplicity minus one). The additional spacer rings 252 and 254 are generally coaxially aligned with the longitudinally extending axis 214 and circumferentially surround, and are attached to, the second coil form segment 220. The additional spacer rings 252 and 254 are each longitudinally disposed between, and abut, a corresponding adjacent pair of the additional superconductive coils 244, 246, and 248. Furthermore, one of the additional superconductive coils 244 longitudinally abuts the supplemental spacer ring 257 and another of the additional superconductive coils 248 longitudinally abuts the second spacer ring 240. Preferably, the additional superconductive coils 244, 246, and 248, comprise non-impregnated niobium-titanium superconductive coils which need to be supported by the second coil form segment 220. Preferably, the additional spacer rings 252 and 254 consist essentially of plastic such as, but not limited to fiberglass or another FRP (fiber reinforced plastic). In a preferred construction, the additional spacer rings 252 and 254 are adhesively bonded to the second coil form segment 220 and are not attached to, and preferably are spaced apart from, the plate members 242. In an exemplary enablement, the magnet 210 moreover includes a coil overwrap (omitted form the figures for clarity), such as an aluminum or non-magnetic stainless steel ring, which circumferentially surrounds each first and second and supplemental superconductive coil and each additional superconductive coil to prevent radially outward movement of such coils due to the electromagnetic forces generated during magnet operation.

The foregoing description of two preferred embodiments of the invention has been presented for purposes of illustration. It is not intended to be exhaustive or to limit the invention to the precise forms disclosed, and obviously many modifications and variations are possible in light of the above teaching. It is intended that the scope of the invention be defined by the claims appended hereto.

We claim:

1. A magnetic resonance imaging magnet comprising:
   a) a generally annularly-cylindrical-shaped first coil form segment having a generally longitudinally extending axis, having a first longitudinal end, having a second longitudinal end, and having a generally constant outer diameter;
   b) a generally annularly-cylindrical-shaped second coil form segment generally coaxially aligned with said axis, having a first longitudinal end, having a second longitudinal end disposed longitudinally proximate said second longitudinal end of said first coil form segment, and having a generally constant outer diameter which is less than said outer diameter of said first coil form segment;
   c) a first superconductive coil generally coaxially aligned with said axis, circumferentially wound around said first coil form segment, having a first lateral side, and having a second lateral side longitudinally disposed proximate said first longitudinal end of said first coil segment;
   d) a second superconductive coil generally coaxially aligned with said axis, circumferentially wound around said second coil form segment, having a first lateral side, and having a second lateral side longitudinally disposed proximate said first longitudinal end of said second coil form segment;
   e) a first spacer ring generally coaxially aligned with said axis, attached to said first coil form segment, and longitudinally abutting said first lateral side of said first superconductive coil;
   f) a second spacer ring generally coaxially aligned with said axis, circumferentially surrounding and attached to said second coil form segment, and longitudinally abutting said first lateral side of said second superconductive coil; and
   g) a plurality of circumferentially-spaced-apart plate members attached to and extending radially outward from said first and second spacer rings and disposed radially outward from and spaced apart from said first and second superconductive coils.

2. The magnet of claim 1, wherein said first superconductive coil is the only superconductive coil which is circumferentially wound around said first coil form segment, and wherein said first spacer ring abuts and connects together said second longitudinal end of said first coil form segment and said second longitudinal end of said second coil form segment.

3. The magnet of claim 2, also including a multiplicity of additional superconductive coils which are generally coaxially aligned with said axis and which are circumferentially wound around said second coil form segment; and further including said multiplicity minus one of additional spacer rings which are generally coaxially aligned with said axis, which circumferentially surround and are attached to said second coil form segment, which are each longitudinally disposed between and abut a corresponding adjacent pair of said additional superconductive coils, and wherein one of said additional superconductive coils longitudinally abuts said first spacer ring and another of said additional superconductive coils longitudinally abuts said second spacer ring.

4. The magnet of claim 3, wherein said first and second coil form segments and said first and second spacer rings consist essentially of metal, wherein said additional spacer rings consist essentially of plastic, wherein said first spacer ring is welded to said second longitudinal end of said first coil form segment and is welded to said second longitudinal end of said second coil form segment, wherein said second spacer ring is welded to said second coil form segment, and wherein said additional spacer rings are adhesively bonded to said second coil form segment.

5. The magnet of claim 1, wherein said first spacer ring circumferentially surrounds said first coil form segment; and also including a supplemental spacer ring which is generally coaxially aligned with said axis, which abuts and connects together said second longitudinal end of said first coil form segment and said second longitudinal end of said second coil form segment, and which is unattached to any of said plate members; and further including a supplemental superconductive coil which is generally coaxially aligned with said axis, which is circumferentially wound around said first coil form segment, and which is longitudinally disposed between and abuts said first spacer ring and said supplemental spacer ring.

6. The magnet of claim 5, also including a multiplicity of additional superconductive coils which are generally coaxially aligned with said axis and which are circumferentially wound around said second coil form segment; and further including said multiplicity minus one of additional spacer rings which are generally coaxially aligned with said axis, which circumferentially surround and are attached to said second coil form segment, which are each longitudinally disposed between and abut a corresponding adjacent pair of said additional superconductive coils, and wherein one of said additional superconductive coils longitudinally abuts said supplemental spacer ring and another of said additional superconductive coils longitudinally abuts said second spacer ring.

7. The magnet of claim 6, wherein said first and second coil form segments and said first and second and supplemental spacer rings consist essentially of metal, wherein said additional spacer rings consist essentially of plastic, wherein said first spacer ring is welded to said first coil form segment, wherein said supplemental spacer ring is welded to said second longitudinal end of said first coil form segment and is welded to said second longitudinal end of said second coil form segment, wherein said second spacer ring is welded to said second coil form segment, and wherein said additional spacer rings are adhesively bonded to said second coil form segment.

8. The magnet of claim 1, also including a generally toroidal-shaped dewar having a circumferential inner wall at least partially defined by said first and second coil form segments and having an annular side wall attached to said first longitudinal end of said first coil form segment; wherein said first and second superconductive coils, said first and second spacer rings, and said plate members are disposed inside said dewar; wherein said dewar contains a liquid cryogen which is in physical contact with said first and second superconductive coils; wherein said second lateral side of said first superconductive coil longitudinally abuts said annular side wall of said dewar; and wherein said plate members are attached to said annular side wall of said dewar.

9. The magnet of claim 8, also including a thermal shield generally spaced apart from and generally surrounding said dewar; a vacuum enclosure generally spaced apart from and generally surrounding said thermal shield; a cryocooler coldhead having a housing attached to said vacuum enclosure, having a first stage in thermal contact with said thermal shield, and having a second stage extending into said dewar; and a recondensing coil attached to said second stage of said cryocooler coldhead.

10. The magnet of claim 1, wherein said first and second superconductive coils carry an electric current in a same first direction, and also including a superconductive shielding coil carrying an electric current in a direction opposite to said first direction, and wherein said superconductive shielding coil is generally coaxially aligned with said axis and is disposed radially outward from and spaced apart from said first and second superconductive coils, and wherein said superconductive shielding coil is supported by said plate members.

* * * * *